(12) United States Patent
Yu

(10) Patent No.: US 6,514,829 B1
(45) Date of Patent: Feb. 4, 2003

(54) METHOD OF FABRICATING ABRUPT SOURCE/DRAIN JUNCTIONS

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/803,831

(22) Filed: Mar. 12, 2001

(51) Int. Cl.[7] .............................................. H01L 21/336
(52) U.S. Cl. ........................ 438/302; 438/286; 438/528
(58) Field of Search ......................... 438/302, 286–291, 438/528

(56) References Cited

U.S. PATENT DOCUMENTS

| | | | |
|---|---|---|---|
| 5,366,915 A | * 11/1994 | Kodama | ..................... 438/257 |
| 5,423,286 A | 6/1995 | Yonehara | |
| 6,008,098 A | 12/1999 | Pramanick et al. | |
| 6,008,099 A | 12/1999 | Sultan et al. | |
| 6,268,640 B1 | * 7/2001 | Park et al. | ................... 257/288 |
| 6,297,104 B1 | 10/2001 | Tyagi et al. | |
| 6,303,450 B1 | * 10/2001 | Park et al. | ................... 438/300 |

OTHER PUBLICATIONS

U.S. patent application Ser. No. 09/817,919 filed Mar. 26, 2001, entitled "MOS Transistor With Reduced Floating Body Effect" by Yu. Attorney Dkt. No. (39153/427).

* cited by examiner

*Primary Examiner*—Jey Tsai
(74) *Attorney, Agent, or Firm*—Foley & Lardner

(57) ABSTRACT

A method of fabricating an integrated circuit forming abrupt source/drain junctions. The process can be utilized for P-channel or N-channel metal oxide field semiconductor effect transistors (MOSFETs) on a silicon-on-insulator (SOI) substrate. The source extension is more conductive than the drain extension. The transistor has reduced short channel effects and strong drive current and yet is reliable.

20 Claims, 2 Drawing Sheets

METHOD OF FABRICATING ABRUPT SOURCE/DRAIN JUNCTIONS

FIELD OF THE INVENTION

The present invention relates to integrated circuits and methods of manufacturing integrated circuits. More particularly, the present invention relates to a transistor and a method of manufacturing it.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-induced barrier-lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion implantation process. Without the sidewall spacers, the doping process vertically introduces dopants into a thin region (i.e., just below the top surface of the substrate) to form the drain and source extensions as well as to partially form the drain and source regions.

After the drain and source extensions are formed, silicon dioxide spacers, which abut lateral sides of the gate structure, are provided over the source and drain extensions. The substrate is vertically doped a second time to form the deeper source and drain regions. The source and drain extensions are not further doped due to the blocking capability of the silicon dioxide spacer.

As transistors disposed on integrated circuits (ICs) become smaller, transistors with source/drain extensions have become more difficult to manufacture. For example, smaller transistors should have ultra-shallow source and drain extensions with less than 30 nanometer (nm) junction depth. Forming source and drain extensions with junction depths of less than 30 nm is very difficult using conventional fabrication techniques. Conventional ion implantation and diffusion-doping techniques make transistors on the IC susceptible to short-channel effects, which result in a dopant profile tail distribution that extends deep into the substrate. Also, conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extension vertically into the bulk semiconductor substrate.

Transistors, such as, metal oxide semiconductor field effect transistors (MOSFETs), are generally either bulk semiconductor-type devices or silicon-on-insulator (SOI)-type devices. Most integrated circuits are fabricated in a CMOS process on a bulk semiconductor substrate.

In bulk semiconductor-type devices, transistors, such as, MOSFETs, are built on the top surface of a bulk substrate. The substrate is doped to form source and drain regions, and a conductive layer is provided between the source and drain regions. The conductive layer operates as a gate for the transistor; the gate controls current in a channel between the source and the drain regions. As transistors become smaller, the body thickness of the transistor (or thickness of depletion layer below the inversion channel) must be scaled down to achieve superior short-channel performance.

Conventional SOI-type devices include an insulative substrate attached to a thin-film semiconductor substrate that contains transistors similar to the MOSFETs described with respect to bulk semiconductor-type devices. The insulative substrate generally includes a buried insulative layer above a lower semiconductor base layer. The transistors on the insulative substrate have superior performance characteristics due to the thin-film nature of the semiconductor substrate and the insulative properties of the buried insulative layer. In a fully depleted (FD) MOSFET, the body thickness is so small that the depletion region has a limited vertical extension, thereby eliminating link effect and lowering hot carrier degradation. The superior performance of SOI devices is manifested in superior short-channel performance (i.e., resistance to process variation in small size transistor), near-ideal subthreshold voltage swing (i.e., good for low off-state current leakage), and high saturation current.

As the physical gate length of MOS transistors shrinks to dimensions of 50 nm and below, ultra-thin-body MOSFETs fabricated on very thin SOI substrates provide significant architectural advantages. The body thickness of such devices can be below 200 Angstroms (Å) to overcome the short-channel effects (e.g., threshold voltage roll-off and drain induced barrier lowering) which tend to be severe in devices with small dimensions.

Source/drain junction formation is very challenging when forming thin film SOI MOSFETs according to conventional processes. More particularly, it is difficult to form abrupt transitions between the source/drain regions and the channel region. These abrupt transistions or junctions are difficult to form due to the effects of a large thermal budget (high temperature).

Conventional processes utilize a high thermal budget to activate dopants, form silicide regions, etc. The large thermal budget tends to increase dopant diffusion, thereby causing the source region and drain region to merge together or short circuit through the channel region. Therefore, it is desirable to control the abruptness of the junction in the lateral direction.

Thus, there is a need for a transistor with abrupt source and drain junctions. Further, there is a need for a method of manufacturing a transistor that has abrupt source and drain junctions. Further still, there is a need for SOI transistors that have abrupt source/drain junctions. Even further still, there is a need for a process of forming abrupt source/drain junctions in the lateral direction.

SUMMARY OF THE INVENTION

An exemplary embodiment relates to a method of manufacturing an integrated circuit. The method includes providing a gate structure between a source location and a drain location on a semiconductor film, providing an angled amorphization implant to the film, and providing a source/drain dopant implant. The method also includes annealing the film.

Another exemplary embodiment relates to a method of manufacturing an ultra large-scale integrated circuit including a plurality of field effect transistors. The method includes steps of: providing at least part of a gate structure on a top surface of a semiconductor substrate; providing a photoresist feature over a portion of a source/drain region; and providing an amorphous region in the semiconductor substrate. The semiconductor substrate includes a first non-amorphous region under the gate and a second non-amorphous region under the photoresist feature. The method further includes steps of: doping the source location and the drain location, and recrystallizing the amorphous region.

Another exemplary embodiment relates to a method of doping a source region or a drain region for a transistor. The transistor includes the gate structure disposed over a channel in a substrate. The source region is heavily doped with dopants of a first conductivity type and the drain region is heavily doped with dopants of the first conductivity type. The method includes amorphizing the substrate at an angle, doping the substrate, and annealing the substrate. Abrupt junctions in the lateral direction for the source region and drain region are formed.

BRIEF DESCRIPTION OF THE DRAWINGS

Exemplary embodiments will hereafter be described with reference to the accompanying drawings wherein like numerals denote like elements, and.

DETAILED DESCRIPTION OF THE PREFERRED EMBODIMENTS

Figure 1:
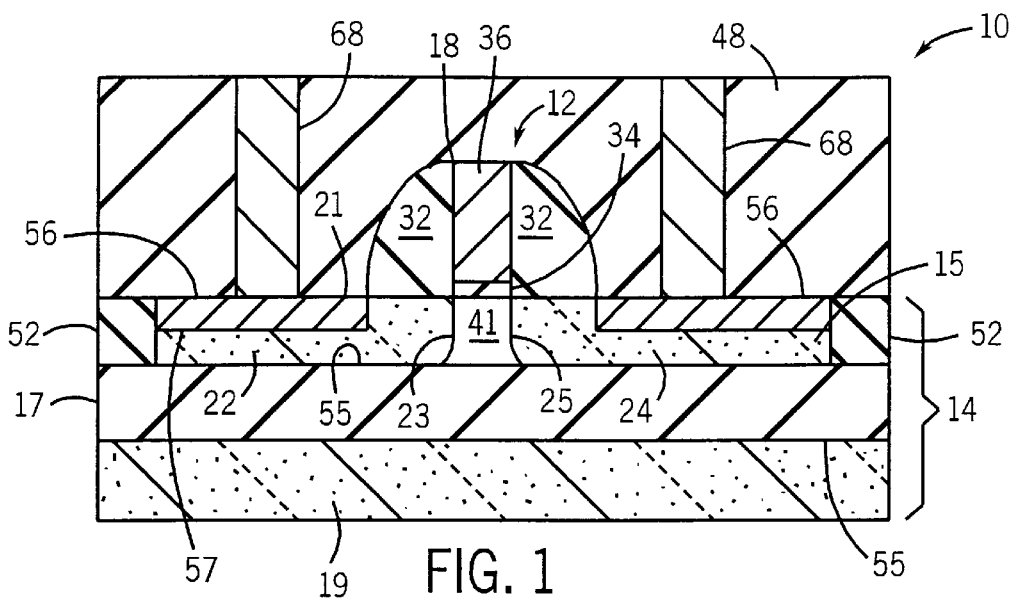
FIG. 1 is a schematic cross-sectional view representation of a portion of an integrated circuit having a transistor with optimized source and drain junctions in accordance with an exemplary embodiment.

With reference to FIG. 1, a transistor 12 is disposed on a semiconductor substrate 14, such as, a wafer. Semiconductor substrate 14 is preferably a semiconductor-on-insulator (SOI) substrate. Preferably, substrate 14 includes a thin film semiconductor layer 15, an insulative layer 17, and a semiconductive base layer 19. Alternatively, layer 15 can be disposed solely on an insulative layer 17.

Layer 17 is preferably a buried oxide layer provided upon a base layer 19 of silicon. Layer 17 is preferably silicon dioxide and has a thickness of 1000–5000 Å. Layer 17 can be formed by oxygen implantation. Layer 15 is preferably a layer of single crystalline silicon having a thickness of 150–600 Å.

Transistor 12 is part of a portion 10 of an integrated circuit (IC) manufactured on a wafer (such as, a silicon wafer). Transistor 12 includes a gate structure 18, a source region 22, and a drain region 24. Regions 22 and 24 extend from a top surface 21 (of layer 15) to a top surface 55 of layer 17. Regions 22 and 24 are 150–600 Å thick (from surface 21 to surface 55) and can include a source extension and a drain extension.

Regions 22 and 24 have a concentration of $10^{19}$ to $10^{20}$ dopants per cubic centimeter. An appropriate dopant for regions 22 and 24 of a P-channel transistor is boron, boron diflouride, or iridium, and an appropriate dopant for regions 22 and 24 of a N-type transistor is arsenic, phosphorous, or antimony.

Source region 22 includes an abrupt junction 23 and drain region 24 includes an abrupt junction 25. Junctions 23 and 25 define a channel region 41 underneath gate structure 18. Junctions 23 and 25 are preferably super abrupt in the lateral direction due to the advantageous low temperature process described below. Therefore, transistor 12 with its small body thickness can overcome short channel effects and yet is not susceptible to a merger of regions 22 and 24.

Junctions 23 and 25 preferably extend from surface 21 to surface 55. Channel region 41 is preferably narrower at surface 21 than at surface 55. Channel region 41 can be 500–1000 Å wide at its widest point and 200–500 Å wide at its narrowest point. In one preferred embodiment, region 41 has a thickness of less than 200 Å from surface 21 to surface 55 to reduce susceptibility to short channel effects.

Gate structure 18 can have a height or thickness of 500–2000 Å and a width of 250–2000 Å. Gate stack or structure 18 includes a gate oxide 34, and a gate conductor 36. Gate structure 18 can also include spacers 32. Spacers 32 can be silicon nitride ($Si_3N_4$), silicon dioxide ($SiO_2$), or other insulative material.

Spacers 32 have the shape of spacers formed by a conventional etch-back process. Spacers 32 can have a width of 300–1000 Å and a height of 500–2000 Å. Gate oxide 34 is preferably thermally grown silicon dioxide on substrate 14 and is 15–30 Å thick. Alternatively, oxide 34 can be a deposited silicon nitride layer or a high-k dielectric layer.

Conductor 36 is preferably disposed over channel region 41. Conductor 36 is preferably a doped polysilicon material having a thickness of 500–2000 Å and a width of 250–2000 Å. Alternatively, conductor 36 can contain germanium or include a metal, such as, titanium nitride (TiN), Molybdenum (Mo), Tungsten (W), or other conductor.

Transistor 12 is disposed between isolation regions 52 in layer 15 of substrate 14. Isolation regions 52 are preferably oxide structures which separate transistor 12 from neighboring transistors. Regions 52 can be formed in a local oxidation of silicon (LOCOS) process, a shallow trench isolation (STI) process, or other insulative structure formation process. Regions 52 can extend from surface 21 to surface 55.

Transistor 12 can be an N-channel or a P-channel field effect transistor, such as, a metal oxide semiconductor field effect transistor (MOSFET) or thin-film SOI transistor. Transistor 12 is preferably part of an ultra-large scale integrated (ULSI) circuit that includes one million or more transistors.

A silicide layer 56 can be formed in or above source region 22 and drain region 24. Silicide layer 56 can be a titanium silicide layer, cobalt silicide layer, tungsten silicide layer, nickel silicide layer, or other material for reducing resistance between contact 68 and regions 22 and 24. Preferably, regions 56 are 200–400 thick from surface 21 to surface 57.

Silicide layer 56 provides connections to contacts 68 provided through an insulative layer 48. Insulative layer 48 can be a 3000–5000 Å thick insulative layer such as silicon dioxide, silicon nitride, or other material. Conductor 36 can also be silicided to reduce series resistance.

With reference to FIGS. 1–6, the fabrication of transistor 12 including an abrupt junction and abrupt junction is described below as follows. The fabrication technique forms source and drain regions 22 and 24 on SOI substrate 14 in a low thermal budget process, thereby allowing regions 22 and 24 to have super abrupt junctions. The low thermal budget reduces the lateral spread of dopants in regions 22 and 24 consequently reducing susceptibility to short circuits in channel region 41.

Figure 2:
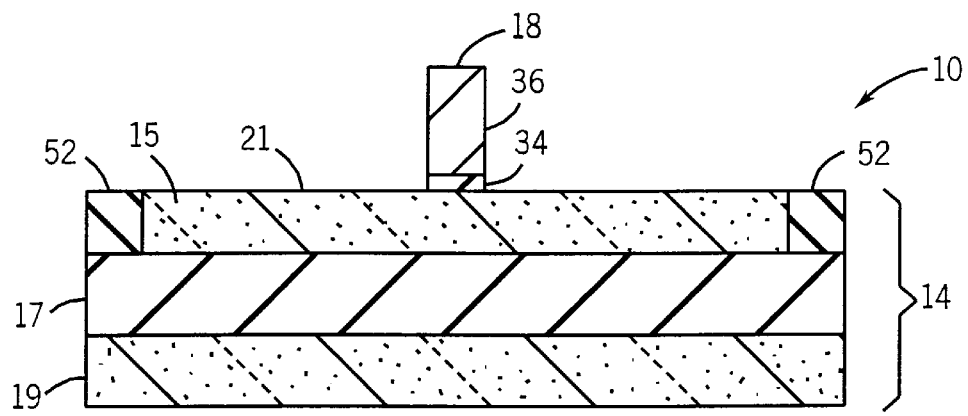
FIG. 2 is a schematic cross-sectional view representation of the portion of the integrated circuit illustrated in FIG. 1, showing a gate structure formation step.

In FIG. 2, transistor 12 can be substantially formed by conventional semiconductor processing techniques to include gate structure 18. Gate structure 18 is comprised of gate oxide 34 and gate conductor 36. Layer 15 includes insulative structures 52 formed by a conventional shallow trench isolation (STI) process.

Gate conductor 36 is 500–2000 Å thick and is configured with a proper work function for transistor 12. In one embodiment, conductor 36 is a metal conductor so there is no need to use a high-temperature rapid thermal anneal (900–1100° C.) to activate dopants in gate structure 18 (as required for doped polysilicon conductors).

Gate structure 18 is formed on layer 15. Layer 15 can be doped with $1-5 \times 10^{17}$ P-type dopants per cubic centimeter, assuming an N-channel transistor. Gate structure 1 8 can be formed by depositing or growing a dielectric layer (oxide 34) on layer 15 and by depositing a metal or polysilicon layer (conductor 36) over the dielectric layer. The dielectric layer and polysilicon layer (the stack) are etched to leave conductor 36 and oxide 34 as structure 18 via a conventional lithographic process. Structure 18 is above channel region 41 between structures 52.

Figure 3:
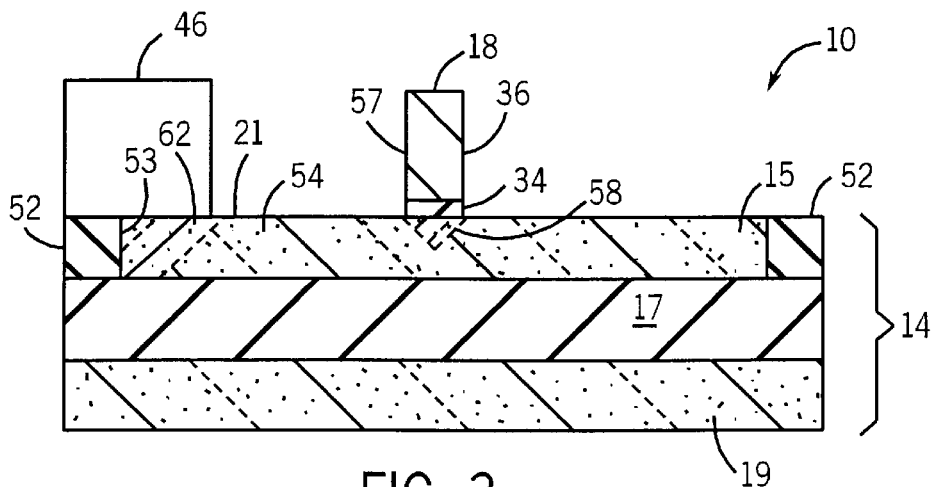
FIG. 3 is a schematic cross-sectional view representation of the portion of the integrated circuit illustrated in FIG. 2, showing a tilt angle amorphous dopant implant step.

In FIG. 3, a photoresist feature 46 is provided above top surface 21 of layer 15. Preferably, photoresist feature 46 is formed in a conventional lithographic process. According to such a process, photoresist material is spun on top surface 21 of layer 15 and thereafter photolithographically patterned to leave structure 46. Preferably, structure 46 is provided above a portion of layer 15. Preferably, the portion includes part of structure 52.

Photoresist feature 46 can be 5000–20,000 Å wide and preferably extends at least 30% percent across source region 22 (e.g., the distance from an edge 53 of structure 52 to an edge 57 of gate structure 18). Preferably, photoresist feature 46 is 3000–5000 Å thick and is sufficient to provide protection during an amorphization implant. Alternatively, feature 46 can be placed over other portions of layer 15 including over drain region 24.

In FIG. 3, after feature 46 is formed, portion 10 is subject to an amorphization implant (e.g., layer 15 is amorphized). Preferably, portion 10 is subjected to neutral dopants (amorphization implant). For example, layers 15 can be amorphized by a low energy implant of germanium, xenon, or silicon. The implant can utilize germanium ions having an energy of 5–10 KeV at a dose $2-4 \times 10^{14}$ dopants per centimeter squared.

Figure 4:
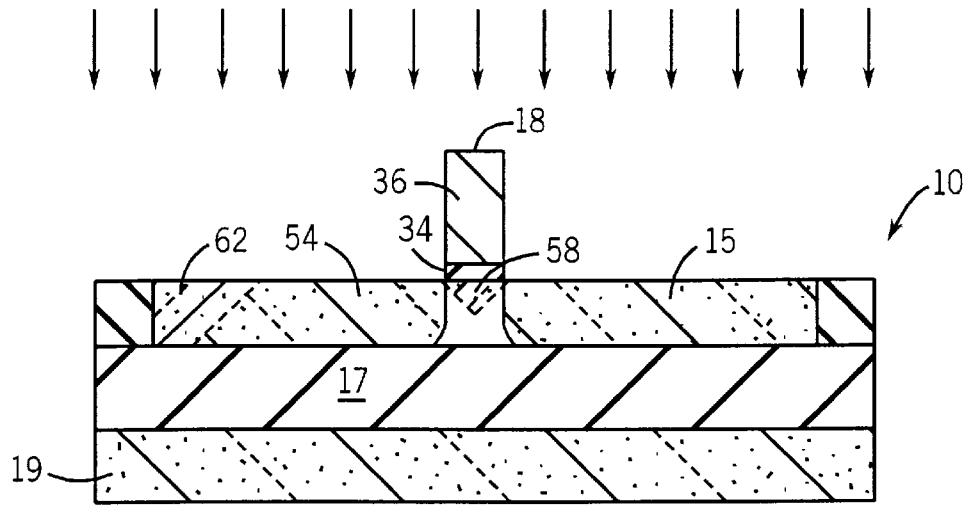
FIG. 4 is a schematic cross-sectional representation view of the portion of the integrated circuit illustrated in FIG. 3, showing a source/drain implant step.

The amorphization implant under low energy creates amorphous region 54 (depicted in FIGS. 3 and 4 as a stippled area). Preferably, the amorphization is performed at an angle so that a region 58 and a region 62 remain as crystalline material (e.g., is unamorphized). The angled implant can be a dual or quad angle implant performed at an angle from 10 to 20 degrees.

Regions 58 and 62 act as seeding regions for subsequent recrystallization of region 54. Region 62 is preferably as thick as layer 15. Region 58 is not as thick as layer 15.

Conductor 36 protects region 58 from the amorphization implant. (Region 58 is under the shadow of gate structure 18). Region 58 has a triangular cross-sectional shape due to the protective properties of conductor 36 and the angle of the implant. Region 58 is preferably 200–1000 Å deep.

Region 62 preferably extends the entire thickness of layer 34 and is protected by photoresist feature 46 during the amorphous implant. Region 62 can be 500–2000 Å wide at its widest point and 200–500 Å wide at its narrowest point. Alternatively, region 62 can be located over drain region 24. Region 62 can have a trapezoidal shape.

After feature 46 is removed from top surface 21 in a conventional stripping process, a source/drain dopant implant is performed. The source/drain implant can be performed vertically (with a zero degree tilt angle). Heavy dopants, such as As, $BF_2$, etc. can be used. In one alternative embodiment, lighter dopants such as boron or phosphorus can be utilized.

Figure 5:
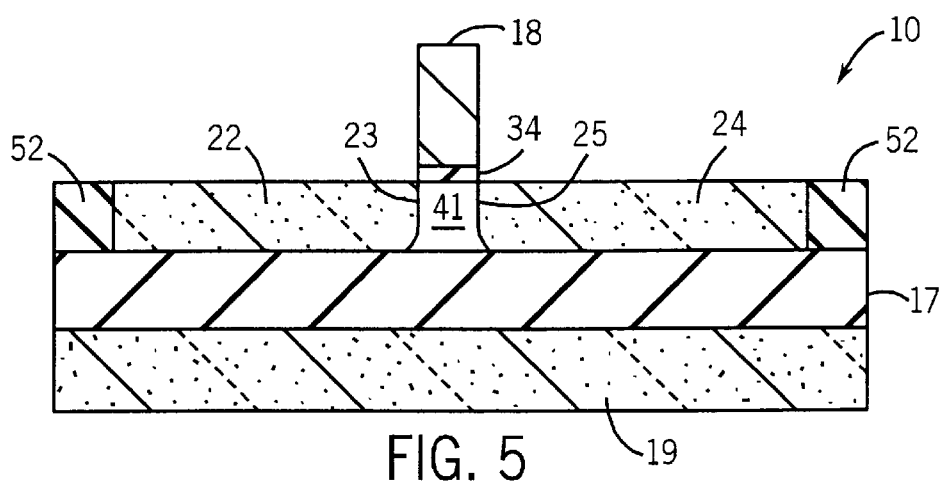
FIG. 5 is a schematic cross-sectional view representation of the portion of the integrated circuit illustrated in FIG. 4, showing an annealing step.

In FIG. 5, portion 10 is subjected to a rapid thermal anneal (RTA). Preferably, a low-temperature (500–600° C.) RTA such as a furnace anneal is utilized to laterally recrystallize region 54. Recrystallization utilizes seeding regions 58 and 62. Dopants within region 54 become well activated due to the annealing step. After annealing, regions 22 and 24 have abrupt junctions 23 and 25, preferably super-abrupt junctions in the lateral direction.

In one embodiment, a solid phase epitaxy technique is utilized to crystallize region 54. Solid phase epitaxy refers to a crystallization process by which an amorphous semiconductor region (silicon, silicon/germanium, or germanium) is converted into crystalline semiconductor (silicon, silicon/germanium, or germanium) of a single orientation matching the orientation of an existing crystal structure (silicon, silicon/germanium, or germanium) start layer (e.g., regions 58 and 62). Solid phase epitaxy is usually achieved by heating the amorphous semiconductor region. Alternatively, a low temperature (e.g., 550–600° C.) rapid thermal anneal can be utilized.

In another alternative, the annealing process is an excimer laser anneal process having a pulse duration of several nanoseconds and a wavelength of 308 nm. Excimer laser annealing can raise the temperature of region 54 to the melting temperature of layer 15 (1100° C. for amorphous silicon). The melting temperature of layer 15 in the amorphous state is significantly lower than that of regions 62 and 58 which are in the crystalline state. For example, the melting temperature of amorphous silicon is 1100° C. and the melting temperature of single crystal silicon is 1400° C. Preferably, the excimer laser annealing process is controlled so that region 54 is fully melted. After the energy associated with the annealing process is removed, region 54 is recrystallized as a single crystal material.

Figure 6:
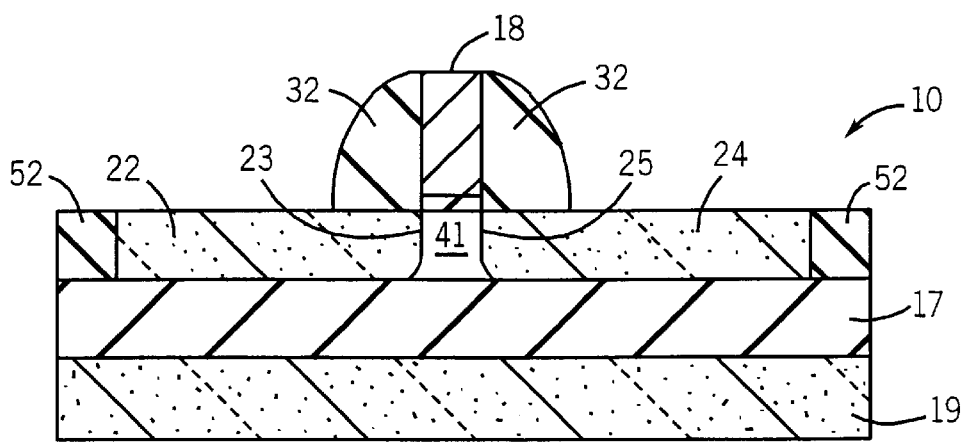
FIG. 6 is a schematic cross-sectional view representation of the portion of the integrated circuit illustrated in FIG. 5, showing a spacer formation step.

In FIG. 6, spacers 32 abut gate structure 18 and are formed in a conventional deposition and etch back process. Spacers 32 are preferably 300–1000 Å wide and 500–2000 Å thick.

After spacers 32 are formed, layers 56 can be formed in a nickel silicidation process to maintain a low thermal budget. After layers 56 are formed, insulative layer 48 is blanket deposited over portion 10.

Layer 48 can be a tetraethylorthosilicate (TEOS) deposited silicon dioxide layer. Contacts 68 can be provided through layer 48 in a conventional etch and fill process.

Convention IC fabrication techniques can complete the integrated circuit.

It is understood that, while preferred embodiments, examples, materials, and values are given, they are for the purpose of illustration only. The apparatus and method of the invention are not limited to the precise details and conditions disclosed. For example, although a triangular shaped region 58 is discussed, other similar shapes can be utilized. Although certain implant characteristics are discussed, other methods could be utilized to dope and morphine the various regions. Thus, changes may be made to the details disclosed without departing from the spirit of the invention, which is defined by the following claims.

What is claimed is:

1. A method of manufacturing an integrated circuit, comprising:

providing a gate structure between a source location and a drain location on a semiconductor film, the source location and the drain location being located between a pair of isolation structures;

providing a photoresist feature over at least one of the pair of isolation structures, the photoresist feature partially covering the source location or the drain location, providing an angled amorphization implant to the film;

providing a source/drain implant; and annealing the film.

2. The method of claim 1, further comprising providing a pair of spacers abutting lateral sides of the gate structure, after the annealing step.

3. The method of claim 2, wherein the angled amorphization implant is between 10–20 degrees in at least two directions.

4. The method of claim 3, wherein the angled amorphization implant uses germanium, xenon, or silicon.

5. The method of claim 1, wherein the annealing step recrystallizes amorphous regions formed by the angled implant.

6. The method of claim 5, wherein a single crystal region under the gate in the film serves as a seed layer.

7. The method of claim 6, wherein the annealing uses lateral solid phase epitaxy.

8. The method of claim 7, wherein the annealing is performed at a temperature below 600° C.

9. The method of claim 1, wherein the photoresist feature is over a portion of the source location.

10. The method of claim 9, wherein a region under the portion serves as a seed for recrystallization during annealing.

11. A method of manufacturing an ultra-large scale integrated circuit including a plurality of field effect transistors, the method comprising steps of:

providing at least part of a gate structure on top surface of a semiconductor substrate;

providing a photoresist feature over a portion of a source region or a drain region, the photoresist feature not covering one of the source region or the drain region and not covering the source region or drain region entirely;

providing an amorphous region with an angled implant in the semiconductor substrate, the semiconductor substrate including a first non-amorphous region under the gate and a second non-amorphous region under the photoresist feature;

doping the source region and the drain region; and recrystallizing the amorphous region.

12. The method of claim 11, further comprising:

providing a pair of spacers abutting lateral sides of the gate structure.

13. The method of claim 11, wherein the recrystallizing step is a lateral solid phase epitaxy step.

14. The method of claim 11, wherein the photoresist feature covers at least 30 percent of the source region.

15. The method of claim 14, wherein the angled implant is performed at an angle between 10 and 20 degrees.

16. The method of claim 11, wherein a super abrupt source junction is formed.

17. The method of claim 16, wherein the super abrupt junction is in the lateral direction.

18. A method of doping a source region or drain region for a transistor, the transistor includes a gate structure disposed over a channel in a substrate, the source region is heavily doped with dopants of a first conductivity type, and a drain region heavily doped with dopants of the first conductivity type, the method comprising:

partially covering the source region or the drain region, amorphizing the substrate at an angle;

doping the substrate to form the source region and the drain region; and annealing the substrate, whereby abrupt junctions in the lateral direction for the source region and the drain region are formed.

19. The method of claim 18, wherein the partially covering step utilizes a photoresist feature, wherein the photoresist feature protects a portion of the substrate associated with the source region or the drain region during amorphizing.

20. The method of claim of claim 19, wherein the annealing step recrystallizes the substrate.

* * * * *